United States Patent [19]
Oh

[11] Patent Number: 5,768,201
[45] Date of Patent: Jun. 16, 1998

[54] BIT LINE SENSE AMPLIFIER ARRAY FOR SEMICONDUCTOR MEMORY DEVICE

[75] Inventor: Young Nam Oh, Ichon, Rep. of Korea

[73] Assignee: Hyundai Electronics Industries Co., Ltd., Kyoungki-do, Rep. of Korea

[21] Appl. No.: 728,355

[22] Filed: Oct. 9, 1996

[30] Foreign Application Priority Data

Oct. 10, 1995 [KR] Rep. of Korea ............... 1995/34677

[51] Int. Cl.$^6$ ................................................ G11C 7/06
[52] U.S. Cl. .................................. 365/205; 365/189.11
[58] Field of Search ............................. 365/189.11, 205

[56] References Cited

U.S. PATENT DOCUMENTS

| | | | |
|---|---|---|---|
| 4,511,997 | 4/1985 | Nozaki et al. | 365/189 |
| 4,546,457 | 10/1985 | Nozaki et al. | 365/230 |
| 5,406,526 | 4/1995 | Sugibayashi et al. | 365/230.03 |
| 5,544,105 | 8/1996 | Hirose et al. | 365/189.11 |

Primary Examiner—David C. Nelms
Assistant Examiner—Michael T. Tran
Attorney, Agent, or Firm—Gary M. Nath; Nath & Associates

[57] ABSTRACT

A bit line sense amplifier array for a semiconductor memory device which has a memory cell array with at least two memory cells sharing a metal strapping region, and a plurality of true and complementary bit lines for transferring data from the at least two memory cells externally or transferring external data to the at least two memory cells. The bit line sense amplifier array comprises at least one sense amplifier block for sensing and amplifying data on the true and complementary bit lines. The sense amplifier block includes first and second sense amplifier array for sensing and amplifying the data on the true and complementary bit lines, respectively, a first bias circuit for applying a first voltage to the first and second sense amplifier array, a second bias circuit for applying a second voltage to the first and second sense amplifier array, a pair of pull-up drivers for generating a restore signal in response to a global restore control signal to drive the first bias circuit, a pair of pull-down drivers for generating a sensing signal in response to a global sensing control signal to drive the second bias circuit, and an equalizer for precharging the true and complementary bit lines with half the first voltage and equalizing voltages supplied to the true and complementary bit lines.

5 Claims, 2 Drawing Sheets

1

BIT LINE SENSE AMPLIFIER ARRAY FOR SEMICONDUCTOR MEMORY DEVICE

BACKGROUND OF THE INVENTION

1. Field of the Invention

The present invention relates in general to semiconductor memory devices, and more particularly to a bit line sense amplifier array for a semiconductor memory device which is operated in response to a plurality of divided restore and sensing signals to sense and amplify data on true and complementary bit lines.

2. Description of the Prior Art

Recently, the number of memory cells for the data storage has gradually been increased due to the higher integration of semiconductor memory devices. As a result, an increased number of memory cells are operated in a refresh mode of each cycle for the data maintenance therein. The increased number of memory cells results in an increase in the number of sense amplifiers for sensing and amplifying bit line voltages of the memory cells.

Conventionally, the sense amplifiers are driven in response to global restore and sensing signals, resulting in the application of an overload to a supply voltage. Such an overload makes the operation speed of the sense amplifiers low. As a result, the semiconductor memory device may be erroneously operated in a high-speed mode.

On the other hand, in a semiconductor memory device such as a synchronous graphic random access memory (SGRAM), a block writing function is provided for the data sensing operation in addition to restore and sensing functions in a dynamic random access memory (DRAM). In the case where the global restore and sensing signals are used in the block writing operation, a time delay occurs in inverting data latched by the global restore and sensing signals. Such a time delay results in he faulty operation of the semiconductor memory device in a high-speed mode.

SUMMARY OF THE INVENTION

Therefore, the present invention has been made in view of the above problem, and it is an object of the present invention to provide a bit line sense amplifier array for a semiconductor memory device which is operated in response to a plurality of divided restore and sensing signals to sense and amplify data on true and complementary bit lines.

In accordance with the present invention, the above and other objects can be accomplished by a provision of a bit line sense amplifier array for a semiconductor memory device which has a memory cell array with at least two memory cells sharing a metal strapping region, and a plurality of true and complementary bit lines for transferring data from at least two memory cells externally or transferring external data to at least two memory cells, comprising at least one sense amplifier block for sensing and amplifying data on the true and complementary bit lines, the sense amplifier block including first and second sense amplifier array for sensing and amplifying the data on the true and complementary bit lines, respectively; first bias means for applying a first voltage to the first and second sense amplifier array; second bias means for applying a second voltage to the first and second sense amplifier array; first drive means for generating a restore signal in response to a global restore control signal to drive the first bias means, the restore signal having the first voltage; second drive means for generating a sensing signal in response to a global sensing control signal to drive the second bias means, the sensing signal having the second voltage; and equalization means for precharging the true and complementary bit lines with half the first voltage and equalizing voltages supplied to the true and complementary bit lines.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
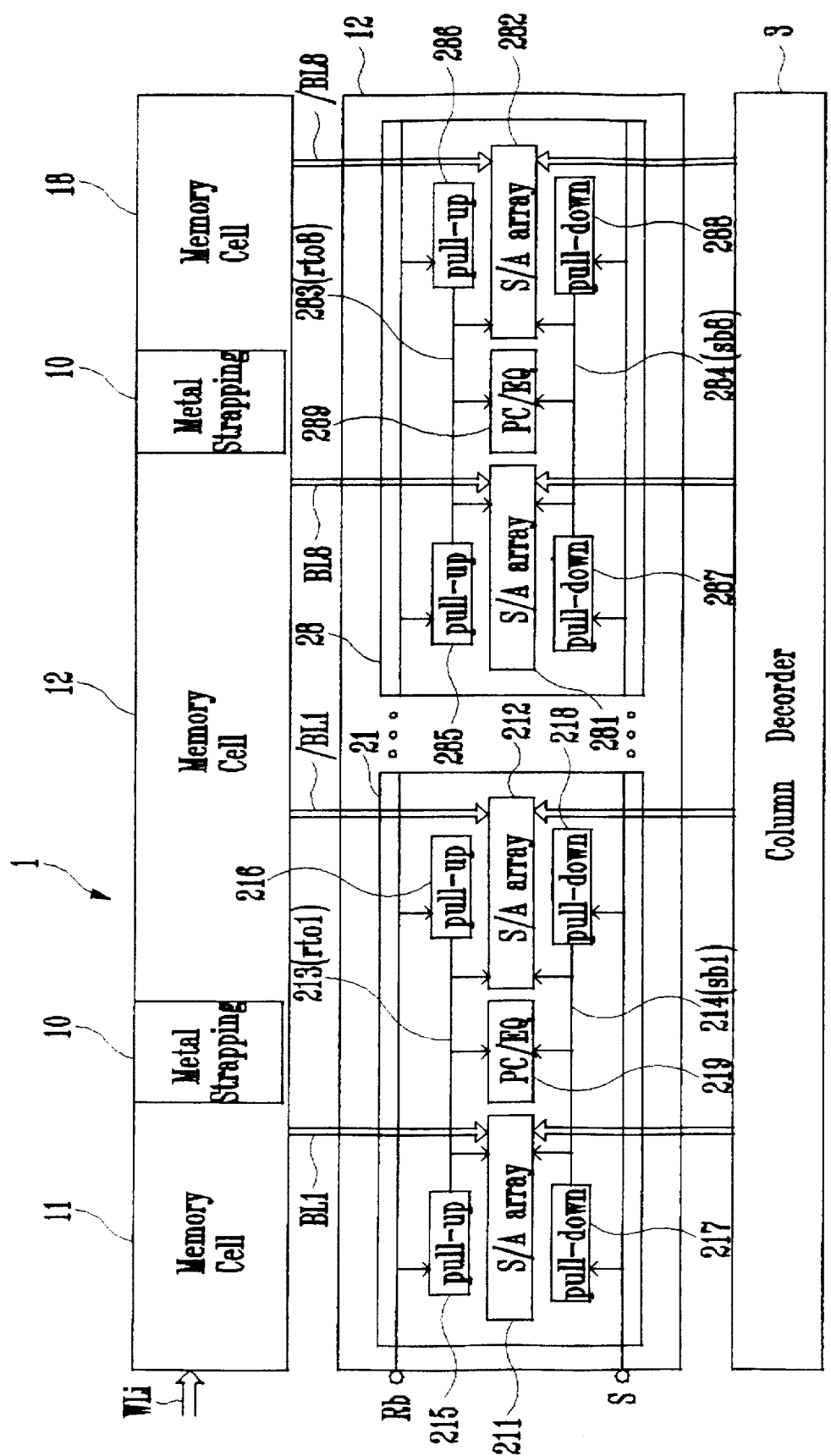
FIG. 1 is a block diagram illustrating the construction of a bit line sense amplifier array for a semiconductor memory device in accordance with an embodiment of the present invention.

Referring to FIG. 1, there is shown in block form the construction of a bit line sense amplifier array for a semiconductor memory device in accordance with an embodiment of the present invention. As shown in this drawing, the bit line sense amplifier array comprises a plurality of sense amplifier blocks 21—28, each of which senses and amplifies data on corresponding ones of true and complementary bit lines BL1 and /BL1—ELS and /BL8.

The sense amplifier block 21 includes first and second sense amplifier array 211 and 212 for sensing and amplifying the data on the corresponding true and complementary bit lines BL1 and /BL1, respectively, a first bias circuit 213 for applying a supply voltage Vdd to the first and second sense amplifier array 211 and 212, a second bias circuit 214 for applying a ground voltage Vss to the first and second sense amplifier 211 and 212, a pair of pull-up drivers 215 and 216 for generating a restore signal rtol in response to a global restore control signal Rb to drive the first bias circuit 213, and a pair of pull-down drivers 217 and 218 for generating a sensing signal sb1 in response to a global sensing control signal S to drive the second bias circuit 214. The restore signal rtol from the pull-up drivers 215 and 216 has the supply voltage level Vdd and the sensing signal sb1 from the pull-down drivers 217 and 218 has the ground voltage level Vss.

The sense amplifier block 21 further includes an equalizer 219 for precharging the true and complementary bit lines BL1 and /BL1 with half the supply voltage Vdd/2 and equalizing voltages supplied to the true and complementary bit lines BL1 and /BL1.

The remaining sense amplifier blocks 22–28 are the same in construction as the sense amplifier block 21 and a description thereof will thus be omitted.

In FIG. 1, the reference numeral 1, not described, designates a memory cell array with a plurality of memory cells 11–18. A metal strapping region 10 is present between adjacent ones of the memory cells 11–18. Also, the reference numeral 3, not described, designates a column decoder.

The operation of the bit line sense amplifier array with the above-mentioned construction in accordance with the preferred embodiment of the present invention will hereinafter be described in detail with reference to FIG. 2.

Figure 2:
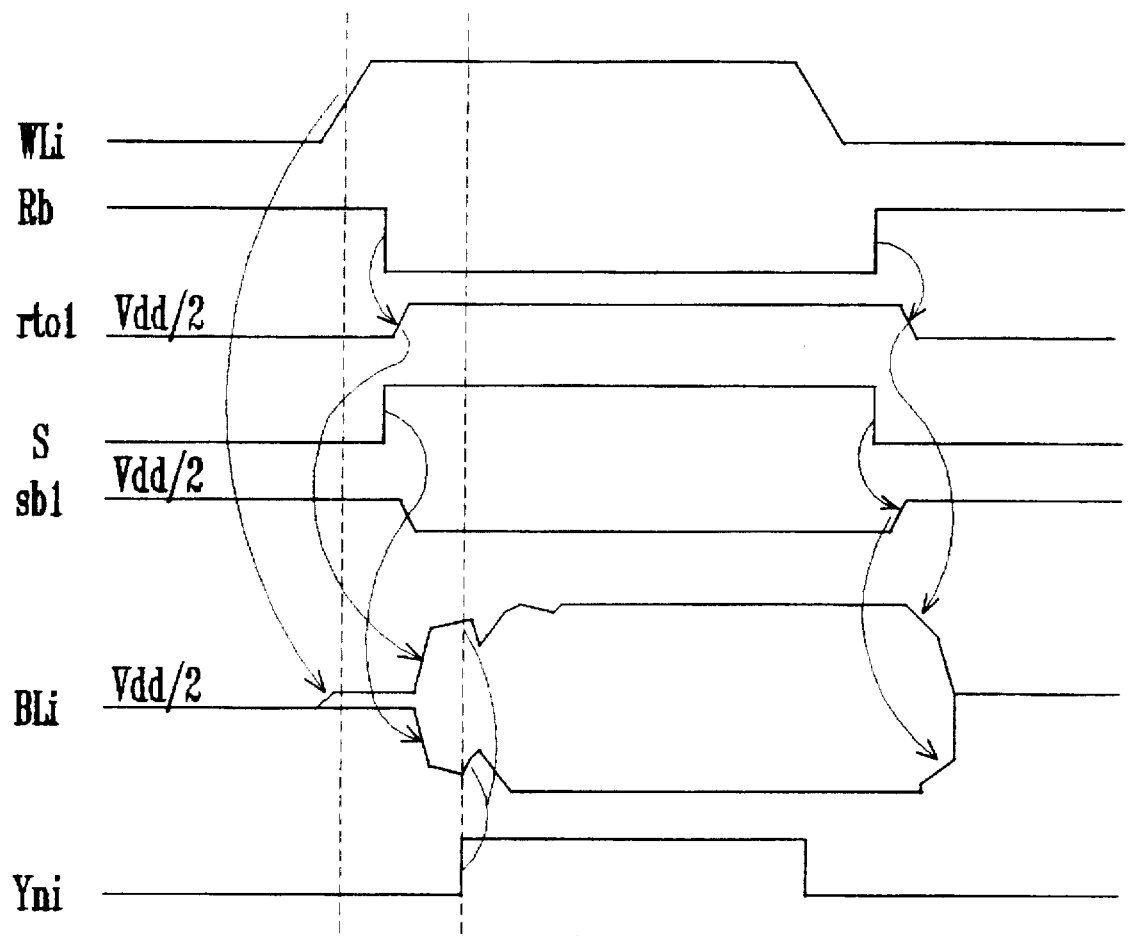
FIG. 2 is a timing diagram illustrating the operation of the bit line sense amplifier array in FIG. 1.

FIG. 2 is a timing diagram illustrating the operation of the bit line sense amplifier array in FIG. 1. The sense amplifier blocks 21-28 are the same in operation. Hence, only the operation of the sense amplifier block 21 will hereinafter be described in detail.

In a standby mode, a word line WLi is low in logic. Also, the first and second bias circuits 213 and 214 and the true and complementary bit lines BL1 and /BL1 are precharged with the half voltage Vdd/2.

At time t1 that the word line WLi is enabled from low to high in logic, data from the memory cells in the memory cell array 1 are transferred to the true and complementary bit lines BL1 and /BL1. Then, in response to a delayed row address strobe signal RAS, the global restore control signal Rb goes from high to low in logic and the global sensing control signal S goes from low to high in logic. As a result, the output signal rtol from the pull-up drivers 215 and 216 is changed from the half voltage level vdd/2 to the supply voltage level Vdd and the output signal sb1 from the pull-down drivers 217 and 218 is changed from the half voltage level Vdd/2 to the ground voltage level Vss.

Then, the first and second sense amplifier array 211 and 212 are driven in response to the output signals rtol and sb1 from the pull-up drivers 215 and 216 and pull-down drivers 217 and 218 to sense and amplify the data on the true and complementary bit lines BL1 and /BL1, respectively. At this time, the equalizer 219 equalizes the voltages Vdd and Vss of the output signals rtol and sb1 from the pull-up drivers 215 and 216 and pull-down drivers 217 and 218. Thus, using separate Vdd and Vss buses for each equalizer 219, the noise is reduced.

At time t2 that the output signal from the column decoder 3 goes from low to high in logic, the data on the true and complementary bit lines BL1 and BL1 are transferred to input/output lines for the data read or write operation.

Preferably, the equalizer 219 may be provided with an NMOS transistor. Also, the equalizer 219 for each segment of the Rb and sb bus under the metal strapping regions inside the memory cell array may be placed.

Although the bit line sense amplifier array has been divided into the eight blocks for illustrative purposes, those skilled in the art will appreciate that it may be divided into more or less blocks such as seven or nine blocks, without departing from the scope and spirit of the invention.

As is apparent from the above description, according to the present invention, the bit line sense amplifier array for the semiconductor memory device is operated in response to the plurality of divided restore and sensing signals to sense and amplify the data on the true and complementary bit lines. Therefore, the load is reduced and the operation speed is increased, thereby making the high-speed operation of the semiconductor memory device more stable as compared with the conventional one based on the global restore and sensing signals.

Although the preferred embodiments of the present invention have been disclosed for illustrative purposes, those skilled in the art will appreciate that various, modifications, additions and substitutions are possible, without departing from the scope and spirit of the invention as disclosed in the accompanying claims.

What is claimed is:

1. A bit line sense amplifier array for a semiconductor memory device which has a memory cell array with at least two memory cells sharing a metal strapping region, comprising:

at least one sense amplifier block biased by a common global restore control signal and a common global sensing control signal activating the sense amplifier block, wherein said sense amplifier block includes:

first and second sense amplifier array for sensing and amplifying data on bit lines, first drive means for generating a restore signal in response to the global restore control signal and driving said first and second sense amplifier array, second drive means for generating a sensing signal in response to a global sensing control signal and for driving said first and second sense amplifier array, and equalization means equalizing the voltage value of the restore signal and the sensing signal with half of the common global restore control signal in standby mode.

2. A bit line sense amplifier array for a semiconductor memory device as set forth in claim 1, wherein the common global restore control signal has a supply voltage level and the common global sensing control signal has a ground voltage level in standby mode.

3. A bit line sense amplifier array for a semiconductor memory device as set forth in claim 1, wherein said first drive means includes a pair of pull-up drivers for driving said first and second sense amplifier array; and said second drive means include a pair of pull-down drivers for driving said first and second sense amplifier array.

4. A bit line sense amplifier array for a semiconductor memory device as set forth in claim 1, wherein said equalization means include an NMOS transistor.

5. A bit line sense amplifier array a semiconductor memory device as set forth in claim 1, wherein said first and second sense amplifier array are alternatively driven in response to the restore signal from said first drive means and the sensing signal from said second drive means.

* * * * *